United States Patent
Haji et al.

(10) Patent No.: US 7,137,195 B2
(45) Date of Patent: Nov. 21, 2006

(54) METHOD FOR MOUNTING ELECTRONIC PARTS ONTO A BOARD

(75) Inventors: Hiroshi Haji, Fukuoka (JP); Wataru Hidese, Fukuoka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 391 days.

(21) Appl. No.: 10/763,495

(22) Filed: Jan. 23, 2004

(65) Prior Publication Data

US 2004/0148769 A1 Aug. 5, 2004

Related U.S. Application Data

(62) Division of application No. 10/212,955, filed on Aug. 6, 2002, now Pat. No. 6,792,676.

(30) Foreign Application Priority Data

Aug. 8, 2001 (JP) ............................ 2001-240819

(51) Int. Cl.
*H05K 3/30* (2006.01)

(52) U.S. Cl. ...................... 29/833; 29/740; 29/721; 29/742; 29/743; 29/739

(58) Field of Classification Search .............. 29/833, 29/740, 743, 739, 721, 742, 834
See application file for complete search history.

(56) References Cited

U.S. PATENT DOCUMENTS

| | | | | |
|---|---|---|---|---|
| 4,951,383 A | * | 8/1990 | Amao et al. | ................... 29/721 |
| 5,839,187 A | * | 11/1998 | Sato et al. | ..................... 29/743 |
| 5,876,556 A | | 3/1999 | Takanami | |
| 6,086,641 A | * | 7/2000 | Shironouchi | ............... 29/25.01 |
| 6,149,047 A | | 11/2000 | Oda | |
| 6,297,075 B1 | | 10/2001 | Odajima et al. | |
| 6,691,405 B1 | * | 2/2004 | Kagei | ......................... 29/832 |

FOREIGN PATENT DOCUMENTS

| | | |
|---|---|---|
| JP | 61-11821 | 1/1986 |
| JP | 3-227029 | 10/1991 |
| JP | 6-275665 | 9/1994 |
| JP | 9-260464 | 10/1997 |
| JP | 11-163001 | 6/1999 |
| JP | 2000-315697 | 11/2000 |

* cited by examiner

*Primary Examiner*—A. Dexter Tugbang
*Assistant Examiner*—Tai Van Nguyen
(74) *Attorney, Agent, or Firm*—Pearne & Gordon LLP

(57) ABSTRACT

Provided is an electronic parts mount apparatus for taking out semiconductor chips from a semiconductor wafer held on a wafer hold section by a transfer head comprising a plurality of suction nozzles and transporting and mounting the semiconductor chips to and on a board has a parts recognition camera disposed in a manner that it can advance to and retreat from the wafer hold section for picking up an image of the semiconductor wafer. Also provided is a method including a parts mounting step for mounting a plurality of semiconductor chips on the board by the transfer head and an image picking up step for picking up a plurality of semiconductor chips to be next taken out by the parts recognition camera which are performed concurrently.

5 Claims, 5 Drawing Sheets

METHOD FOR MOUNTING ELECTRONIC PARTS ONTO A BOARD

BACKGROUND OF THE INVENTION

1. Field of the Invention

This invention relates to an electronic parts mount apparatus and an electronic parts mount method for taking out an electronic part in wafer shape such as a semiconductor chip and mounting the electronic part on a board of a lead frame, etc.

2. Description of the Related Art

An electronic part cut out in wafer shape, such as a semiconductor chip, of electronic parts used with electronic machines hitherto has been taken out by a mount apparatus including a dedicated taking but unit and mounted on a board of a lead frame, etc. In the dedicated unit, a transfer head for taking out a semiconductor chip moves up and down at a fixed taking out position and a semiconductor wafer is held so that the semiconductor wafer is horizontally movable relative to the transfer head. The semiconductor wafer is moved in order, whereby one semiconductor chip at a time is taken out by the transfer head. The semiconductor chip to be taken out is registered to the transfer head by picking up an image of the electronic part in wafer shape by a camera fixedly placed on a wafer hold section and recognizing the position of the electronic part.

SUMMARY OF THE INVENTION

However, conventional mount apparatus described above, only one semiconductor chip is mounted in one mount turn in which the transfer head reciprocates between the wafer hold section and the lead frame, and the tact time is delayed because the image pickup operation by the camera in the wafer hold section and the mount operation by the transfer head are performed in the same cycle. Therefore, there is a limit on improvement of the mount efficiency.

It is therefore an object of the invention to provide an electronic parts mount apparatus and an electronic parts is mount method capable of efficiently taking out electronic parts in wafer shape and mounting the electronic parts on a board.

According to the invention, there is provided an electronic parts mount apparatus for taking out electronic parts in wafer shape and, transporting and mounting the electronic parts to and on a board by a transfer head, the apparatus including a wafer hold section for holding the electronic parts in wafer shape; a board positioning section for positioning the board; a plurality of suction nozzles provided on the transfer head for sucking and holding the electronic parts; a head move means for moving the transfer head between the wafer hold section and the board positioning section, and performing registration operation of the transfer head when the electronic parts are taken out in the wafer hold section and when the electronic parts are mounted in the board positioning section; an image pickup means disposed in a manner that the image pickup means can advance to and retreat from the wafer hold section, the image pickup means for picking up an image of the electronic parts in the wafer state when the image pickup means advances to above the wafer hold section; a position detection means for detecting the positions of the electronic parts based on image data provided by picking up the image of the electronic parts; and a control section for controlling the head move means based on the position detection result.

According to the invention, there is also provided An electronic parts mount method for taking out electronic parts in wafer shape and transporting and mounting the electronic parts to and on a board by a transfer head including a plurality of suction nozzles, the method including the steps of image picking up for picking up an image of the electronic parts in wafer shape by advancing an image pickup means to above a wafer hold section for holding the electronic parts, wherein the image pick up means is disposed in a manner that the image pick up means can advance to and retreat from the wafer hold section; position detecting for detecting positions of the electronic parts based on image data obtained by the step of image picking up; parts taking out for controlling the head move means based on a result of the step of position detecting, and taking out the electronic parts in order from the wafer hold section by the transfer head; and parts mounting for moving the transfer head to above the board positioned by a board positioning section, and mounting the electronic parts on the board; wherein the steps of parts mounting and image picking up for the electronic parts to be next taken out are performed concurrently.

By the above mentioned configuration and/or method, the transfer head for taking out electronic parts and transferring the electronic parts to a board comprises a plurality of suction nozzles and the step of parts mounting in the board positioning section and the step of image picking up for the electronic parts to be next taken out in the wafer hold section are performed concurrently. Therefore, the number of electronic parts per mount turn can be increased, the tact time can be shortened, and the electronic parts in the wafer state can be efficiently taken out and mounted on the board.

Figure 1:
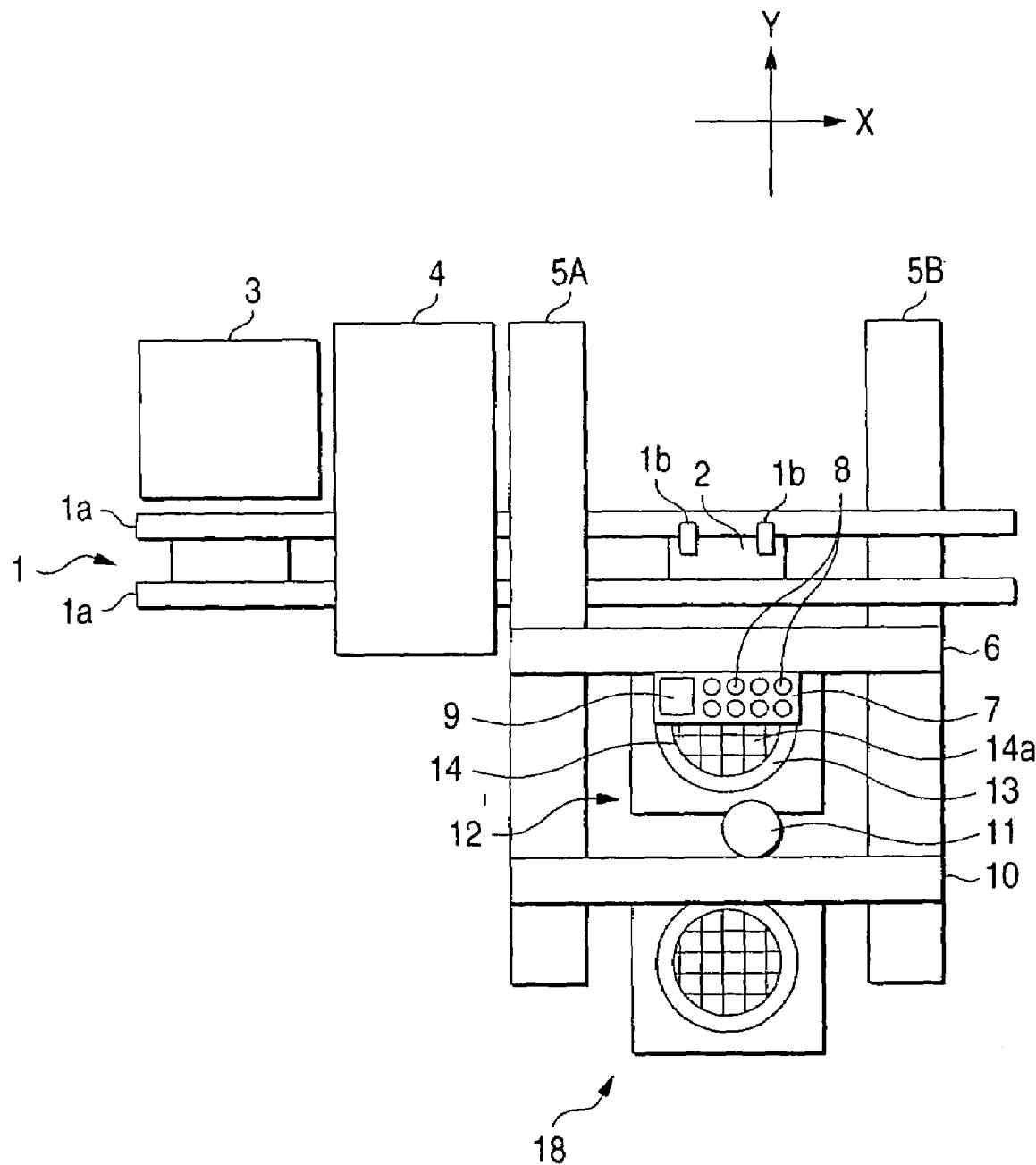
FIG. 1 is a plan view of an electronic parts mount apparatus of one embodiment of the invention.

In the figures, reference numeral 1 refers to a board transport section; 2 to a board; 5A and 5B to Y-axis tables; 6 to a first X-axis table; 7 to a transfer head; 8 to a Suction nozzle; 9 to a board recognition camera; 10 to a second X-axis table; 11 to a parts recognition camera; 12 to a wafer hold section; 14 to a semiconductor wafer; 14a to a semiconductor chip; and 23 to an image recognition section, respectively.

DETAILED DESCRIPTION OF THE PREFERRED EMBODIMENTS

Figure 2:
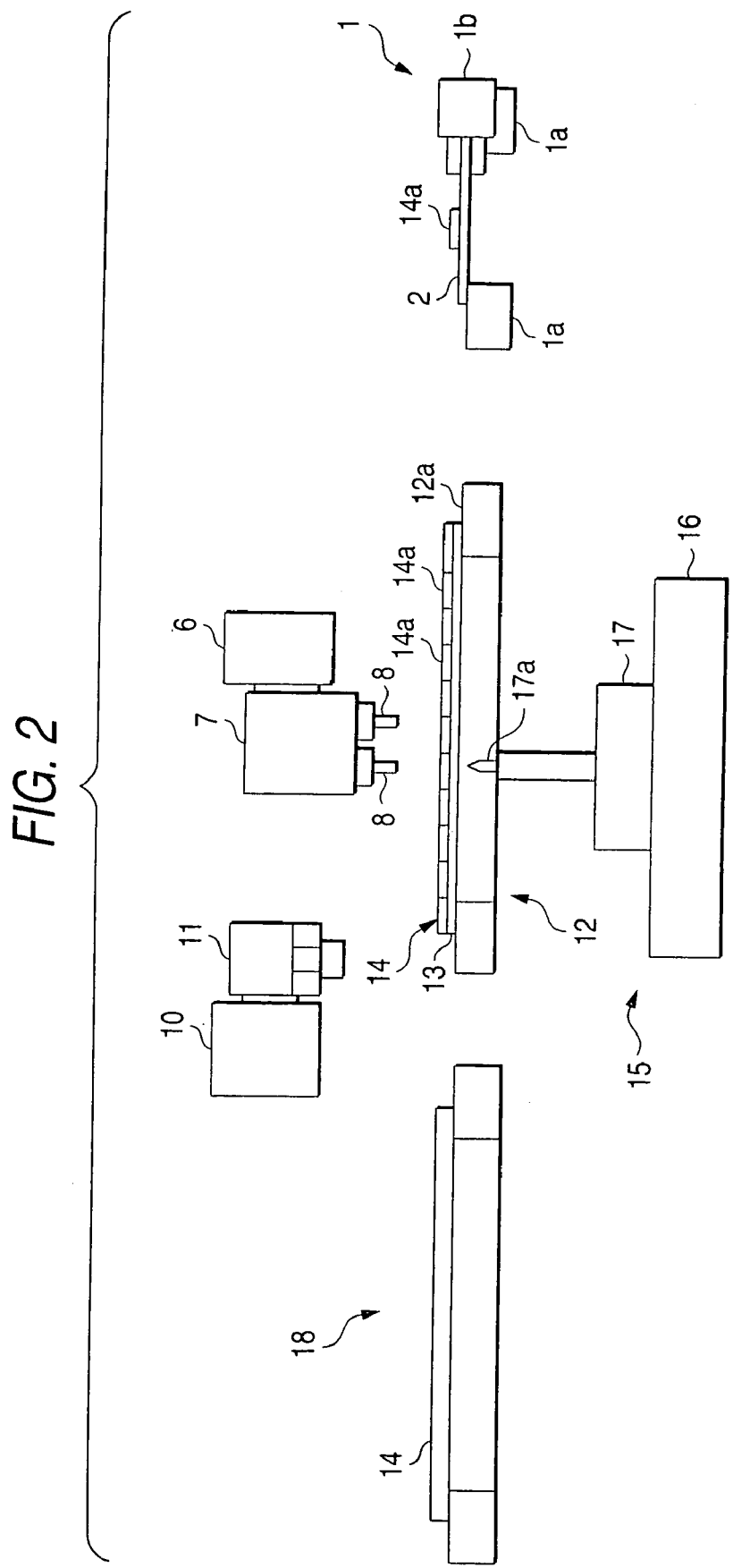
FIG. 2 is a sectional view of the electronic parts mount apparatus of the embodiment of the invention.
Figure 3:
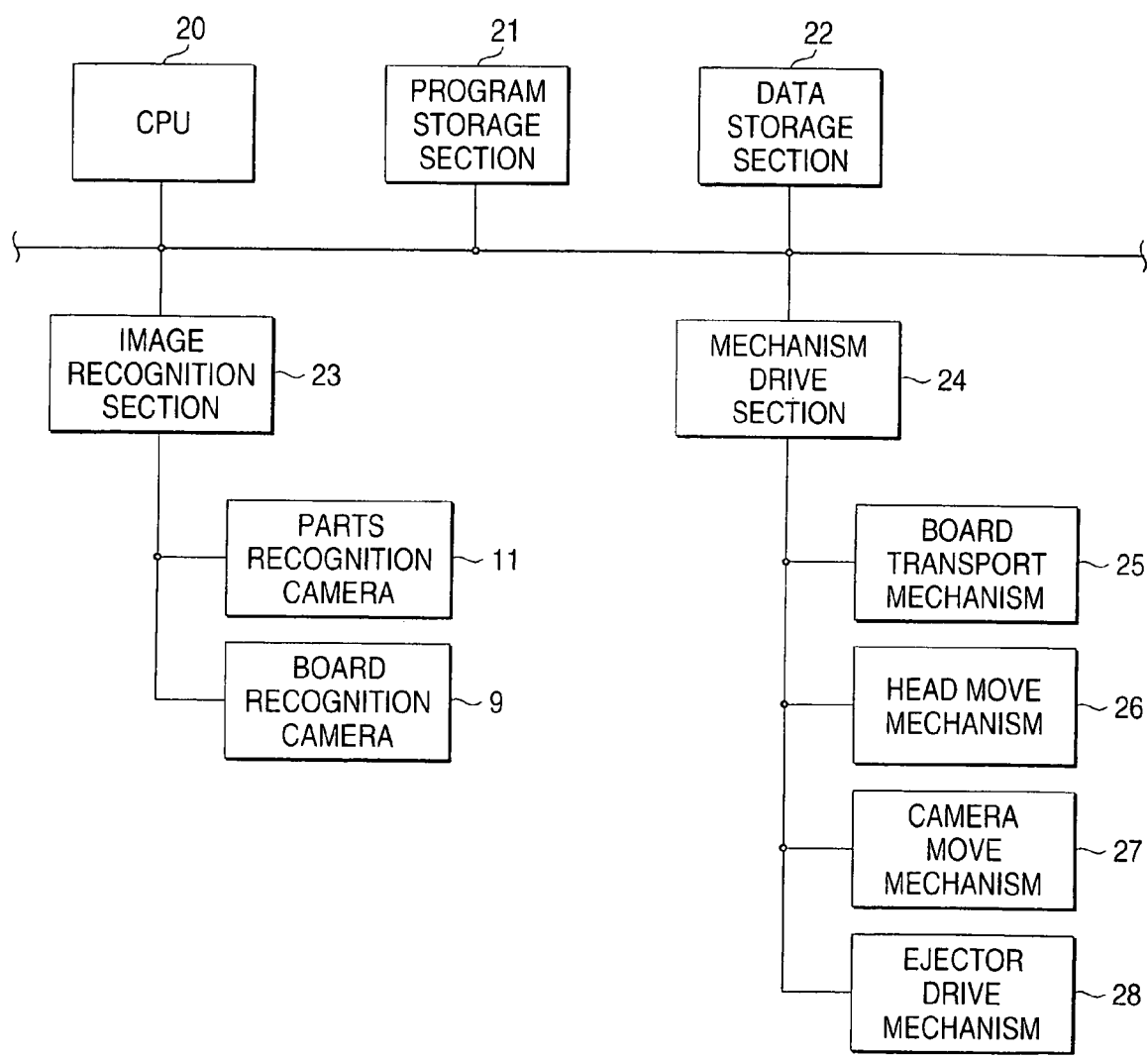
FIG. 3 is a block diagram to show the configuration of a control system of the electronic parts mount apparatus of the embodiment of the invention.

An embodiment of the invention will be explained with reference to the accompanying drawings. FIG. 1 is a plan view of an electronic parts mount apparatus of one embodiment of the invention, FIG. 2 is a sectional view of the electronic parts mount apparatus of the embodiment of the invention, FIG. 3 is a block diagram to show the configuration of a control system of the electronic parts mount apparatus of the embodiment of the invention, and FIGS. 4A, 4B, 5A, and 5B are process explanation drawings of the electronic parts mount method of the embodiment of the invention.

To begin with, the whole configuration of the electronic parts mount apparatus will be explained with reference to FIGS. 1 and 2. In FIG. 1, in the electronic parts mount apparatus, a board transport section 1 including two transport passages 1a is disposed in an X direction. In one of transport passage 1a, a chuck mechanism 1b for chucking and holding a board 2 is disposed movably in the transport direction (X direction). The chuck mechanism 1b holding an end part of the board 2 moves along the transport passage 1a, whereby the board transport section 1 transports the board 2 and positions the board 2 at each work position of paste application, electronic part mounting, etc., described later.

A board supply section 3 and a paste application section 4 are disposed upstream of the board transport section 1 (left in FIG. 1). The board supply section 3 supplies the board 2 on which an electronic part is to be mounted downstream via the board transport section 1. The paste application section 4 applies a paste for bonding electronic parts to a part mount position on the supplied board 2.

Y-axis tables 5A and 5B are disposed in a direction orthogonal to the board transport section 1 downstream from the paste application section 4. The board transport section 1 between the Y-axis tables 5A and 5B serves as a board positioning section for positioning the board 2; here an electronic part is mounted on the board 2.

A wafer hold section 12 is disposed adjacent to the board positioning section. The wafer hold section 12 holds a wafer sheet 13 on which a large number of separate semiconductor chips 14a of electronic parts are put on a hold table 12a. That is, the wafer hold section 12 holds the semiconductor chips 14a in wafer shape. A wafer stock section 18 for holding a new semiconductor wafer 14 in a standby mode is placed adjacent to the wafer hold section 12.

As shown in FIG. 2, an ejector mechanism 15 is disposed below the wafer hold section 12. The ejector mechanism 15 comprises a moving table 16, and a pin hoisting and lowering mechanism 17 for moving up and down a pin 17a is placed on the moving table 16. As the moving table 16 is driven, the pin hoisting and lowering mechanism 17 moves in the X and Y directions below the semiconductor wafer 14.

As the pin hoisting and lowering mechanism 17 is driven with the pin 17a registered below any desired semiconductor chip 14a, the pin 17a pushes up the semiconductor chip 14a from the lower face of the wafer sheet 13. In this state, a suction nozzle 8 of a transfer head 7 sucks the upper face of the semiconductor chip 14a and rises, whereby the semiconductor chip 14a is taken out from the wafer hold section 12.

A first X-axis table 6 and a second X-axis table 10 are placed on the Y-axis tables 5A and 5B. A transfer head 7 including a plurality of suction nozzles 8 is attached to the first X-axis table 6 and a board recognition camera 9 is disposed adjacent to the suction nozzles 8 in a manner that the board recognition camera 9 can be moved integrally with the transfer head 7. As the Y-axis table 5A and the first X-axis table 6 are driven, the transfer head 7 and the board recognition camera 9 are moved in one piece. The Y-axis table 5A and the first X-axis table 6 serve as a head move mechanism for moving the transfer head 7.

A parts recognition camera 11 is attached to the second X-axis table 10. As the Y-axis table 5B and the second X-axis table 10 are driven, the parts recognition camera 11 is moved horizontally in the X and Y directions and advances to and retreats from the wafer hold section 12 within the horizontal plan above the wafer hold section 12. An image of the lower part is picked up by the parts recognition camera 11 placed at any desired position above the wafer hold section 12, whereby an image of any desired position of the semiconductor wafer 14 is picked up. Recognition processing is performed for the image data provided by picking up the image, the position of any desired semiconductor chip 14a can be recognized.

The transfer head 7 is registered to the semiconductor chip 14a to be taken out based on the position recognition result and the moving table 16 is driven for registering the pin 17a to the semiconductor chip 14a, whereby the semiconductor chip 14a is picked up from the wafer hold section 12 by the suction nozzle 8 of the transfer head 7. At this time, a plurality of semiconductor chips 14a are picked up by a plurality of suction nozzles 8 of the transfer head 7, whereby a plurality of semiconductor chips 14a can be taken in one mount turn in which the transfer head 7 reciprocates between the board 2 and the wafer hold section 12.

Next, the configuration of the control system will be described with reference to FIG. 3. In FIG. 3, a CPU 20 is a control section for performing centralized control of sections described below. A program storage section 21 stores various programs such as an operation program for executing the mount operation of the transfer head 7 and a processing program for performing recognition processing of board recognition, parts recognition, etc. A data storage section 22 stores various pieces of data such as mount data. An image recognition section 23 performs recognition processing of the image data provided by image pickup of the parts recognition camera 11 and the board recognition camera 9, thereby recognizing the board 2 in the board transport section 1 and the semiconductor chip 14a in the wafer hold section 12 and detecting their positions. Therefore, the image recognition section 23 serves as position detection means. Additionally, the head move mechanism 26 serves as head move means, and the parts recognition camera 11 serves and the board recognition camera 9 serve as image pickup means.

A mechanism drive section 24 drives the following mechanisms under the control of the CPU 20: A board transport mechanism 25 is a mechanism for driving the chuck mechanism 1b in the board transport section 1. A head move mechanism 26 (head move means) moves the transfer head 7 by the Y-axis table 5A and the first X-axis table 6. A camera move mechanism 27 moves the parts recognition camera 11 by the Y-axis table 5B and the second X-axis table 10. The ejector drive mechanism 28 drives the moving table 16 and the pin hoisting and lowering mechanism 17 for causing the pin 17a to push up the chip. When the CPU 20 controls the head move means, it registers the transfer head 7 relative to the wafer hold section 12 based on the position detection result of the image recognition section 23.

Figure 4A:
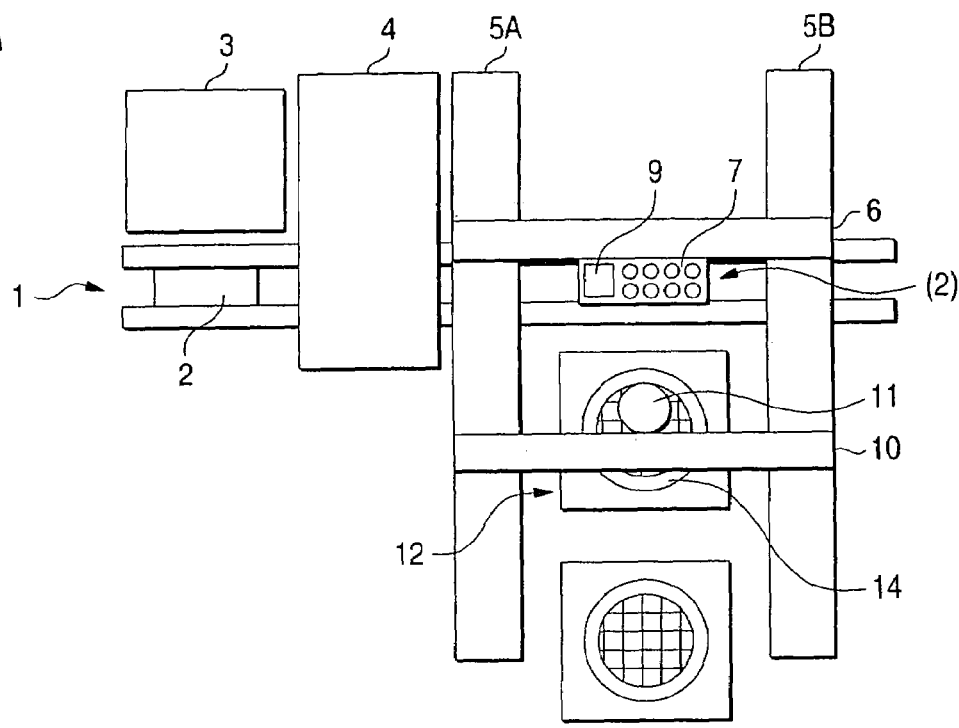
FIGS. 4A and 4B are block diagrams for explaining a process of an electronic parts mount method of the embodiment of the invention.

The electronic parts mount apparatus is configured as described above. The electronic parts mount operation will be discussed with reference to FIGS. 4A, 4B, 5A, and 5B. In FIG. 4A, the board 2 is supplied to the board transport section 1 by the board supply section 3. A paste for bonding electronic parts is applied to the board 2 by the paste application section 4 and then is transported to the board positioning section between the Y-axis tables 5A and 5B and is positioned. After this, the transfer head 7 is moved to above the board 2 by the first X-axis table 6 and an image of the board 2 is picked up by the board recognition camera 9. Recognition processing of the image data provided by picking up an image of the board 2 is performed by the image recognition section 23, whereby the position of the board 2 is recognized.

At this time, the parts recognition camera 11 moved by the second X-axis table 10 is positioned above the wafer hold section 12 and picks up an image of a plurality of semiconductor chips 14a to be next taken out concurrently with picking up an image of the board 2 by the board recognition camera 9 (a step of image picking up). Recognition processing of the image data provided by picking up an image of the semiconductor chips 14a is performed by the image recognition section 23, whereby the positions of the semiconductor chips 19a to be next taken out are recognized (a step of position detecting).

Figure 4B:
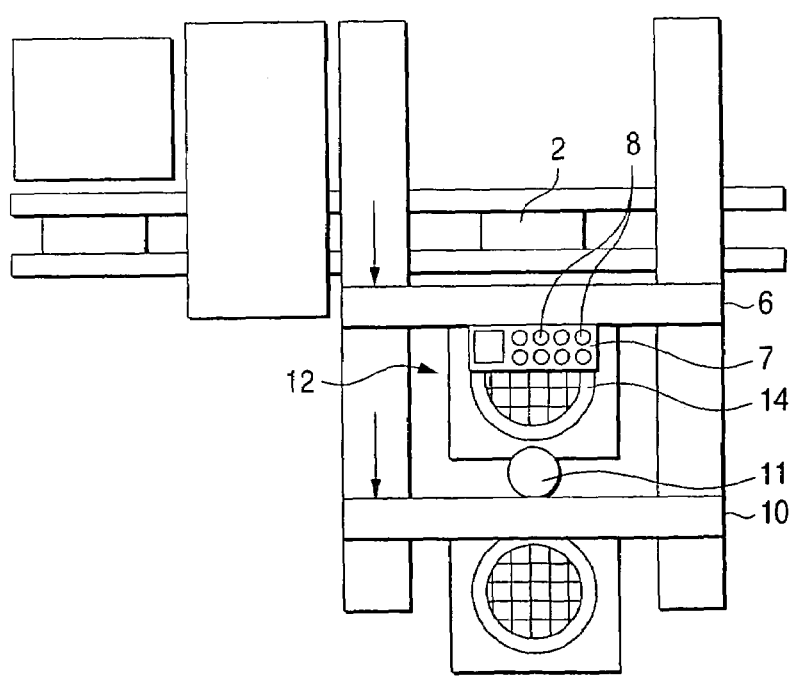

After this, as shown in FIG. 4B, the parts recognition camera 11 retreats from above the wafer hold section 12 to the front side and the transfer head 7 moves to above the wafer hold section 12. The semiconductor chips 14a are taken out in order from the wafer hold section 12 by the suction nozzles 8 of the transfer head 7 based on the position recognition result of the semiconductor chips 14a (a step of parts taking out).

Figure 5A:
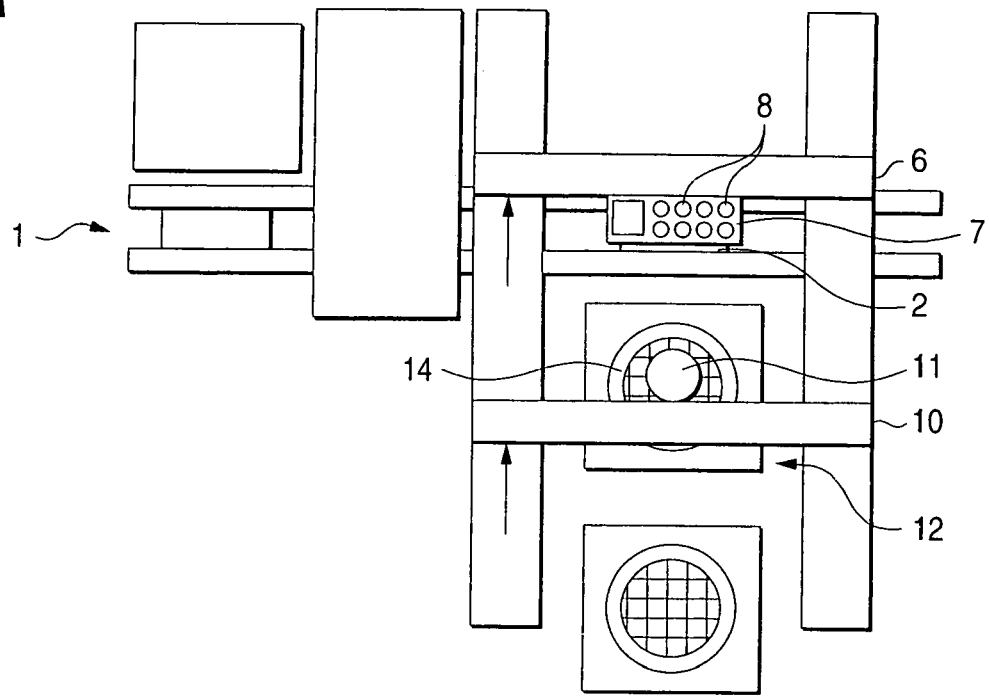
FIGS. 5A and 5B are block diagrams for explaining a process of the electronic parts mount method of the other embodiment of the invention.

The transfer head 7 holding the semiconductor chips 14a on the suction nozzles 8 is moved to above the board 2 positioned on the board transfer section 1 as shown in FIG. 5A. Next, the suction nozzles 8 are moved down in order to the mount points of the board 2, whereby the semiconductor chips 14a are mounted on the board 2 (a step of parts mounting). To mount the semiconductor chips 14a on the board 2, the transfer head 7 is registered relative to the board 2 based on the position recognition result of the board 2.

In parallel with the step of parts mounting, the parts recognition camera 11 advances to above the wafer hold section 12 and picks up an image of a plurality of semiconductor chips 14a to be next taken out. That is, here the step of parts mounting on the board 2 by the transfer head 7 and the step of image picking up for the electronic pars to be next taken out by the parts recognition camera 11 in the wafer hold section 12 are performed concurrently.

Figure 5B:
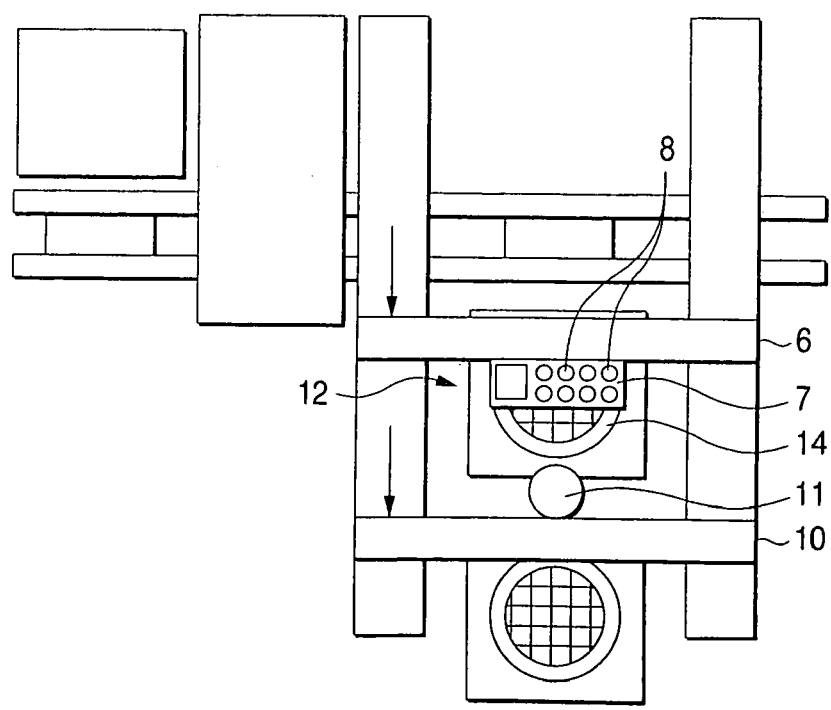

In FIG. 5B, the parts recognition camera 11 retreats from above the wafer hold section 12 to the front side and the transfer head 7 moves to above the wafer hold section 12 to take out the parts in a similar manner to that in FIG. 4B, and the step of parts taking out and the step of parts mounting similar to those described above are repeated.

As described above, in the embodiment, a plurality of semiconductor chips 14a are transported to the board 2 at the same time by the transfer head 7 comprising a plurality of suction nozzles 8 and are mounted on the board 2 in order in one mount turn in which the transfer head 7 reciprocates between the wafer hold section 12 and the board 2. Further, the mount operation on the board by the transfer head 7 and the image pickup operation of the semiconductor chips 14a to be next taken out in the wafer hold section 12 are conducted concurrently.

Thus, it is made possible to drastically improve the mount efficiency as compared with the mount work of die bonding apparatus in the related art transferring and mounting one semiconductor chip 14a in one mount turn and performing the mount operation by the transfer head and the image pickup operation in the wafer hold section in the same cycle. Since a plurality of semiconductor chips 14a can be mounted in one mount turn, the move speed of the transfer head 7 can be set to stable speed with a margin without being set to excessively high speed, the shock when the transfer head 7 stops in the mount operation can be eased, a mount position shift can be prevented, and the mount position accuracy can be provided.

According to the invention, the transfer head for taking out electronic parts and transferring the electronic parts to a board comprises a plurality of suction nozzles and the step of parts mounting in the board positioning section and the step of image picking up for the electronic parts to be next taken out in the wafer hold section are performed concurrently, so that the number of electronic parts per mount turn can be increased, the tact time can be shortened, and the electronic parts in the wafer state can be efficiently taken out and mounted on the board.

What is claimed is:

1. An electronic parts mount method for taking out electronic parts in wafer shape and transporting and mounting the electronic parts to and on a board using transfer head including a plurality of suction nozzles, the method comprising the steps of:

picking up an image of the electronic parts in wafer shape by advancing an image pickup means to above a wafer hold section for holding the electronic parts, wherein the image pick up means is disposed in a manner that the image pick up means can advance to and retreat from the wafer hold section;

detecting positions of the electronic parts based on the image of the electronic parts controlling be l head move means for moving the transfer head based on the detected positions, and taking out the electronic parts in order from the wafer hold section by using the transfer head; and wherein the step of mounting the electronic parts is performed concurrently with the step of picking up an image of the electronic parts to be next taken out-are.

2. The electronic parts mount method according to claim 1, wherein, in the step of picking up the image, the image picked up by the pickup means, when the image pick up means is advanced to above the wafer hold section, is of a plurality of electronic parts.

3. The electronic parts mount method according to claim 2, wherein, the plurality of electronic parts whose image is picked up by the image pickup means are electronic parts to be next taken out by the transfer head.

4. The electronic parts mount method according to claim 1, wherein, in the step of picking up the image, the image pickup means retreats to the front side of the side of a wafer stock section placed adjacent to the wafer hold section after picking up the image of the electronic parts, and the transfer head is moved to above the wafer hold section.

5. An electronic parts mount method for taking out electronic parts in wafer shape and transporting and mounting the electronic parts to and on a board using transfer head including a plurality of suction nozzles, the method comprising the steps of:

picking up an image of the electronic parts in wafer shape by advancing an image pickup means to above a wafer hold section for holding the electronic parts, wherein the image pick up means is disposed in a manner that the image pick up means can advance to and retreat from the wafer hold section;

detecting positions of the electronic parts based on the image of the electronic parts;

controlling a head move means for moving the transfer head based on the detected positions, and taking out the electronic parts in order from the wafer hold section using the transfer head; and moving the transfer head to above the board that is positioned by a board positioning section, and mounting the electronic parts on the board;

wherein, in the step of picking up the image, the image pickup means retreats to the front side of the side of a wafer stock section placed adjacent to the wafer hold section after picking up the image of the electronic parts, and the transfer head is moved to above the wafer hold section.

* * * * *